US011200361B1

(12) United States Patent
Bingham et al.

(10) Patent No.: US 11,200,361 B1
(45) Date of Patent: Dec. 14, 2021

(54) SCALABLE MODEL CHECKING IN FUNCTIONAL VERIFICATION BY INTEGRATING USER-GUIDED ABSTRACTION

(71) Applicant: International Business Machines Corporation, Armonk, NY (US)

(72) Inventors: Bradley Donald Bingham, Austin, TX (US); Viresh Paruthi, Austin, TX (US); Steven Mark German, Wayland, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/011,226

(22) Filed: Sep. 3, 2020

(51) Int. Cl.
*G06F 30/30* (2020.01)
*G06F 30/33* (2020.01)

(52) U.S. Cl.
CPC .................................. *G06F 30/33* (2020.01)

(58) Field of Classification Search
CPC ....................................................... G06F 30/33
USPC ........................................................ 716/106
See application file for complete search history.

(56) References Cited

U.S. PATENT DOCUMENTS

| | | | | |
|---|---|---|---|---|
| 6,975,976 | B1* | 12/2005 | Casavant | G06F 30/33 703/14 |
| 7,493,247 | B2 | 2/2009 | Memmi | |
| 7,647,572 | B1 | 1/2010 | Ip et al. | |
| 7,661,050 | B2* | 2/2010 | Huben | G01R 31/318385 714/733 |
| 7,917,873 | B1* | 3/2011 | Canfield | G01R 31/318314 716/104 |
| 8,234,617 | B2* | 7/2012 | Chetput | G06F 30/33 716/136 |
| 8,302,044 | B2* | 10/2012 | Moon | G06F 30/3323 716/106 |

(Continued)

FOREIGN PATENT DOCUMENTS

WO WO2005070139 A2 8/2005

OTHER PUBLICATIONS

Ray, S., "Scalable Techniques for Formal Verification", Dept. Computer Sciences, University of Texas, Austin, Austin, USA, Springer-Verlag US 2010, DOI https://doi.org/10.1007/978-1-4419-5998-0, BOOK, 2010, 242 pages.

*Primary Examiner* — Jack Chiang
*Assistant Examiner* — Brandon Bowers
(74) *Attorney, Agent, or Firm* — Scully, Scott, Murphy & Presser, P.C.

(57) ABSTRACT

A method, system and computer program product for appending abstractions to a testbench used for verifying the design of an electronic circuit. According to an embodiment of the invention, a method comprises identifying a set L of one or more support properties l for a set P of one or more properties p for a given electronic circuit; computing a plurality of hardware signals s of the given electronic circuit; and creating a plurality of abstract signals ABS, including declaring a fresh abstract signal abs_s for each of the hardware signals s, and creating a fresh abstract signal abs_l for each of the support properties l of the set L; for each of the properties p of the set P, creating an abstract property version abs_p; and appending the abstract signals ABS and the abstract property abs_p to the testbench to form an appended testbench.

20 Claims, 6 Drawing Sheets

(56) References Cited

U.S. PATENT DOCUMENTS

| | | | |
|---|---|---|---|
| 8,401,828 B1 * | 3/2013 | Bhattacharya | G06F 30/367 703/2 |
| 8,726,241 B1 | 5/2014 | Limondin et al. | |
| 9,389,983 B2 | 7/2016 | Sakallah et al. | |
| 9,483,593 B2 | 11/2016 | Hartung et al. | |
| 10,268,786 B2 * | 4/2019 | Muthiah | G06F 30/20 |
| 10,346,571 B2 * | 7/2019 | Darbari | G06F 11/076 |
| 2005/0209840 A1 | 9/2005 | Baklashov et al. | |

* cited by examiner

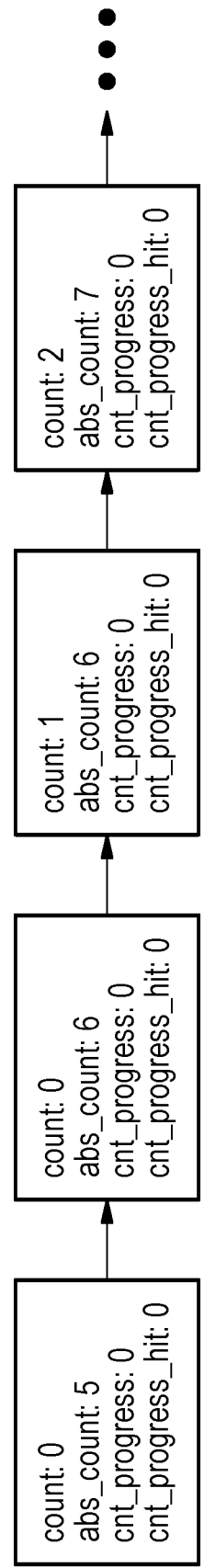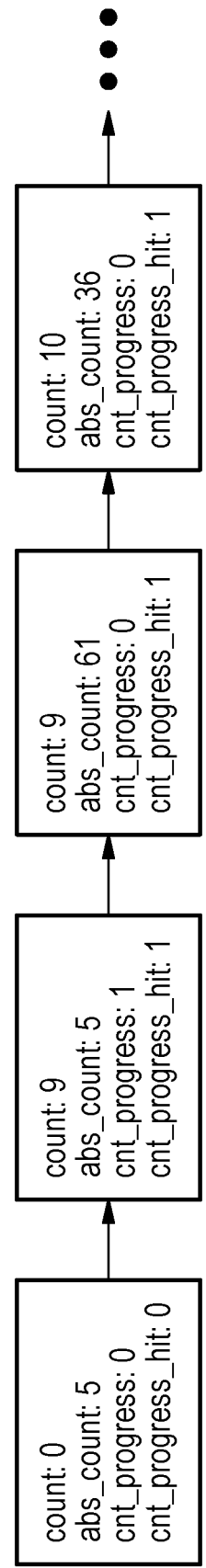
FIG. 3(a)
FIG. 3(b)

Hardware Livelock Events –> Abstract Fairs

SCALABLE MODEL CHECKING IN FUNCTIONAL VERIFICATION BY INTEGRATING USER-GUIDED ABSTRACTION

BACKGROUND

This invention relates generally to functional verification of digital circuit designs, and more specifically, to using formal verification to verify the properties of digital circuit designs.

Over the last fifty years, the complexity of integrated circuits has increased greatly. This increase in complexity has exacerbated the difficulty of verifying circuit designs. Aspects of the circuit design such as time-to-market greatly depend on the verification step.

As the complexity in circuit design has increased, there has been a corresponding improvement in various kinds of verification and debugging techniques. These verification and debugging techniques have evolved from relatively simple transistor circuit-level simulation (in the early 1970s) to the current art that uses Register Transfer Language (RTL)-level simulation. RTL describes the registers of a computer or digital electronic system and the way in which data are transferred among the registers.

SUMMARY

Embodiments of the invention provide a method, system and computer program product for appending abstractions to a testbench used for verifying the design of an electronic circuit. In an embodiment, the comprises identifying a set L of one or more support properties l for a set P of one or more properties p for a given electronic circuit; computing a plurality of hardware signals s of the given electronic circuit, including computing one or more hardware signals appearing in the one or more of the support properties l of the set L, and computing one or more hardware signals appearing in one or more of the properties p of the set P; and creating a plurality of abstract signals ABS, including declaring a fresh abstract signal abs_s for each of the hardware signals s, and creating a fresh abstract signal abs_l for each of the support properties l of the set L; for each of the properties p of the set P, creating an abstract property version abs_p; and appending the abstract signals ABS and the abstract property abs_p to a testbench, used for verifying the design of the electronic circuit, to form an appended testbench.

BRIEF DESCRIPTION OF THE SEVERAL VIEWS OF THE DRAWINGS

FIGS. 3(a) and 3(b) show example executions of hardware fail events that may be identified in an embodiment of this invention.

DETAILED DESCRIPTION

The design flow of a circuit design begins with the creation of a circuit design at the RTL level using RTL source code. Creation of the RTL source code is followed by verification of the design to check if the RTL source code meets various design specifications. This verification may be performed by simulation of the RTL code using a test bench, which includes stimulus generators and requirement monitors. The verification method involving the use of RTL source code and test bench is referred to as the simulation process.

The increasing complexity of circuit designs has lead to several drawbacks associated with simulation-based techniques. Reasons for these drawbacks include the requirement of a large amount of time to verify circuit designs, the use of a large amount of resources and thus large costs, and the inability to verify large designs completely and quickly.

An increasingly popular alternative is to use formal methods to verify the properties of a design. In formal verification, the functionality of a design of an integrated circuit is tested or verified using formal proofs. The formal verification environment includes a number of properties and constraints. The properties include user assertions, which are used to validate the functionality of the circuit design. Known methods may be used to prove or disprove the user assertions, subject to the given constraints, thus indicating whether the circuit design has the correct functionality.

Tools that use formal methods to verify RTL source code and design properties are known as model checkers. Formal verification methods are more exhaustive when compared to simulation methods. Moreover, formal verification methods provide many advantages over the simulation methods, such as reduced validation time, quicker time-to-market, reduced costs, and high reliability.

Performance limits and resource availability inhibit the widespread use of model checking. The resources required to perform verification are typically exponentially related to the number of registers in the circuit model, as well as other characteristics. This is referred to as the "state space explosion" problem.

In an RTL-level formal verification effort, it is often the case that properties of interest are too complex for automatic model checking. Due to the state-space explosion problem, this can easily occur for industrial designs when checking state-assertions, and is even more common when checking liveness, which is well known to be more computationally complex.

When such intractability is encountered, there are a few techniques a verification engineer might resort to, including manual abstraction or black-boxing, decomposing the design into separate testbenches, and providing hints to the model checking tool to guide the algorithms.

Figure 1:
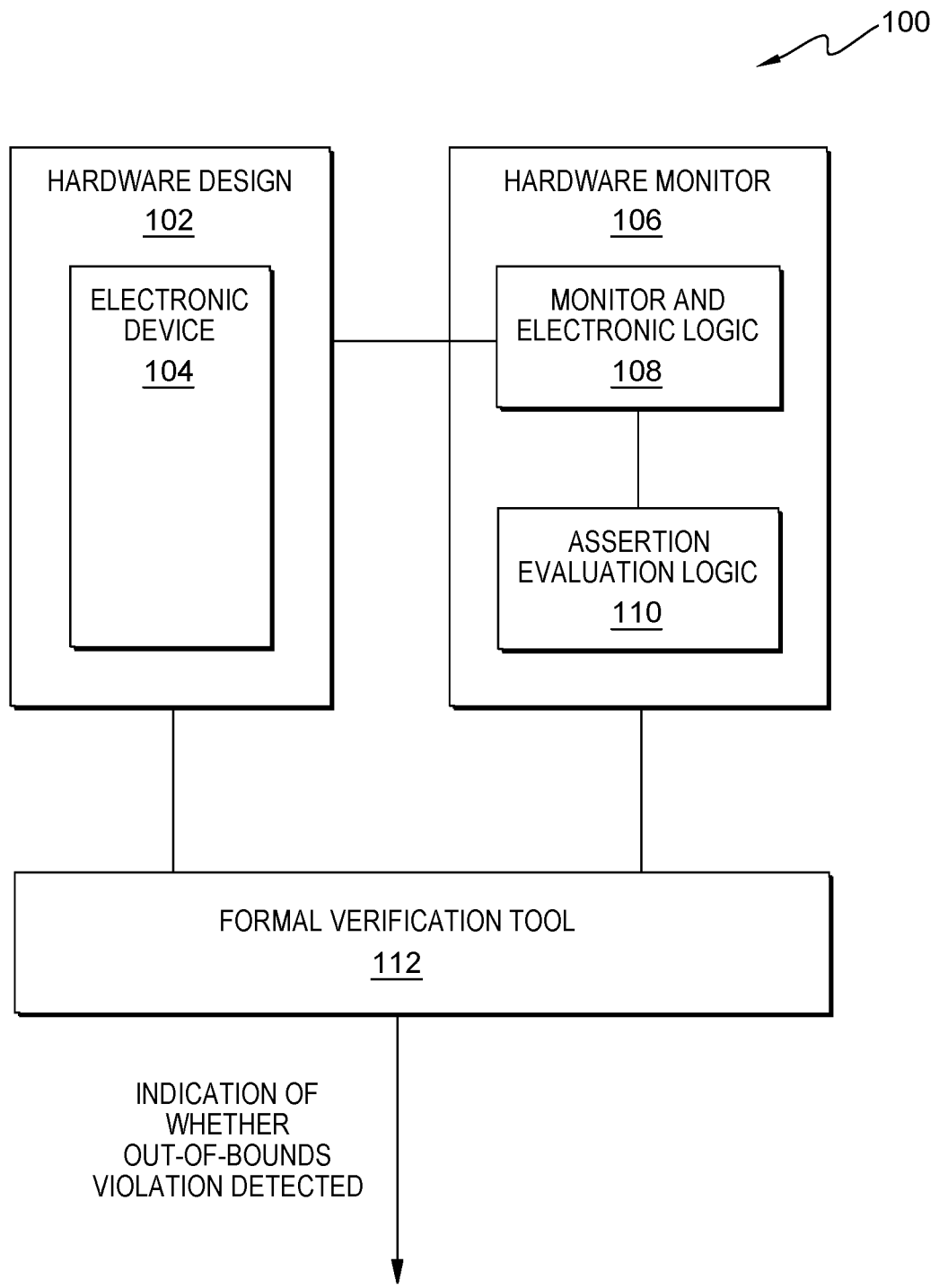
FIG. 1 is a block diagram of an example system for formal verification of a hardware digital circuit design in accordance with an embodiment of the invention.

Reference is now made to FIG. 1 which illustrates an example system 100 for detecting violations in a hardware design using formal verification. The system 100 comprises a hardware design 102 that describes an electronic device 104; a hardware monitor 106 comprising monitor and detection logic 108 and assertion evaluation logic 110, and a formal verification tool 112. Monitor and detection logic 108 is configured to repeatedly monitor the current operating state of an instantiation of the hardware design 102, and assertion evaluation logic 110 is configured to evaluate one or more assertions that assert a formal property. Formal verification tool 112 is configured to use the hardware monitor 106 to exhaustively verify that the hardware design 102 does not have a bug or error.

A formal property may be asserted or covered. When a formal property is asserted it must always be true. In contrast, when a property is covered, the property must be true at least once, but is not required to be true always. An asserted property is said to form an assertion. An example assertion of the property a=b is assert property (a=b). Similarly, a covered property is said to form a cover. An example cover of the property a=b is cover property (a=b).

A formal property that is covered is verified by searching the reachable state space of the instantiation of the hardware design (e.g. state transition system) for at least one valid state in which the property is true. Once a valid state is found in which the property is true, then the searching ceases. In contrast, a formal property that is asserted is verified by confirming the property is true for all valid states (as defined by formal constraints).

When the formal verification tool 112 is used to verify an assertion, the formal verification tool 112 may output an indication of whether or not the assertion is valid (i.e. is true for all valid states or sequence of states), which may also be referred to herein as the assertion being successfully verified. The output may be yes, the assertion is valid or has been successfully verified; no, the assertion is not valid (i.e. it is not true or has failed for at least one valid state or sequence of states) or has not been successfully verified; or the formal verification was inconclusive.

Embodiments of the invention employ user-guided abstraction and hints to yield tractable proofs, without altering the design-under-test (DUT).

Embodiments of the invention provide a method, system and computer program product for appending abstractions to a testbench used for verifying the design of an electronic circuit. In an embodiment, the method comprises identifying a set L of one or more support properties l for a set P of one or more properties p for a given electronic circuit; computing a plurality of hardware signals s of the given electronic circuit, including computing one or more hardware signals appearing in the one or more of the support properties l of the set L, and computing one or more hardware signals appearing in one or more of the properties p of the set P; and creating a plurality of abstract signals ABS, including declaring a fresh abstract signal abs_s for each of the hardware signals s, and creating a fresh abstract signal abs_l for each of the support properties l of the set L; for each of the properties p of the set P, creating an abstract property version abs_p; and appending the abstract signals ABS and the abstract property abs_p to a testbench, used for verifying the design of the electronic circuit, to form an appended testbench.

In an embodiment, the creating an abstract signal abs_l for each of the support properties l includes creating one or more features for the abstract signal abs_l according to a given set of rules.

In an embodiment, the creating one or more features for the abstract signal abs_l according to a given set of rules includes creating a conditional constraint for the abstract signal abs_l according to the given set of rules.

In an embodiment, the creating one or more features for the abstract signal abs_l according to a given set of rules includes creating a latch for abs_l according to the given set of rules.

In an embodiment, the abstract property abs_p created for the each property p is an abstract fail property if said each property p is a fail property; and the abstract property abs_p created for the each property p is an abstract livelock property if said each property p is a livelock property.

In an embodiment, each of the abstract signals ABS satisfies conditional constraints and is otherwise non-deterministic.

In an embodiment, the method further comprises identifying one or more constraints relating the abstract signals ABS and the support properties l of the set L.

Embodiments of the invention employ a user-defined abstraction feature for formal verification of RTL-level hardware designs. Important features of the invention include:

Automation: Given a formal testbench and a list of support properties over DUT signals, a combined hardware/abstraction testbench is automatically generated. This generated tool bench has the same signals and properties as the original testbench, but includes fresh abstract copies of all signals mentioned in the support properties, driven as nondeterministic inputs. New assumptions are added that constrain these abstract signals, but only if it is provable that the corresponding assumption holds on the hardware model. New properties are added for each top-level property over only the abstract signals.

Soundness: The abstraction is contained within the testbench alongside the original hardware model. This avoids any soundness issues introduced by ad-hoc human managing of multiple testbenches. The relationship between the hardware and abstract models is clearly understood and formally enforced. As assumptions on the abstract model are only used if the corresponding property is proven, it is sound to propose support properties that are falsifiable or intractable.

Customization: Embodiments of the invention allow for different formal engines to be run on different properties, and leverage a feature common in model checkers to reuse proven properties as assumptions. This gives the human freedom to guide the proof effort, and for efficient proof regression.

Extensible: The abstraction can be layered multiple times to form a series of increasingly abstract models, all within a single testbench.

In addition, the abstraction approach is sound for arbitrary LTL, given either native LTL property language support, or using well-known LTL to Buchi automata construction.

Tool Independent: Embodiments of the invention are compatible with RTL model checking tools, and in particular do not require any insight or changes to the model checking algorithms used.

Experts in formal verification who understand certain design details are well-equipped to decompose an intractable property by writing support properties over internal DUT signals. These support properties are written in order to be simultaneously (a) easy enough to discharge with direct model checking by leveraging localization approaches, and possibly different engines for different properties, and (b) strong enough to collectively imply the intractable, top-level property.

In embodiments of the invention, a formal verification engineer proposes a set of support properties, to be proven directly on the hardware model using model checking. An abstraction is automatically generated from this set, such that a property in the abstraction is only assumed if the corresponding property in the hardware model is proven. This abstraction is appended to the existing DUI testbench, and gives the user the freedom to directly prove support properties using a formal engine chosen for a specific property. By construction, the abstraction is over-approximate, in that if the top-level property is proven in the abstraction, it is soundly inherited in the hardware model.

Two common outcomes of this approach are that either (a) some support property is intractable to directly model check, or (b) the collection of support properties do not imply the top-level property.

In the case when some support property is intractable, a more detailed abstraction can be taken, by exposing more internal signals of the design and writing properties over these signals that are easier for model checking to cope with. This is also instructive to the formal verification engineer as it exposes where the intractability arises from, and can expose subtle driving bugs that are causing a top-level property to be difficult to automatically prove, but is not falsifiable.

In the case where the support properties do not imply the top-level property, the set of support properties are insufficient, and in embodiments of the invention, a counterexample path will be produced that can be viewed over abstract copies of signals, that demonstrates why the implication does not hold.

A "FAIL" property p checks if any state along any exploration path satisfies p (aka, a "p-state"). Typically, p is a characterization that this state is "bad".

A "LIVELOCK" property p checks if there are any paths that include an infinite sequence of p-states. Typically, p is a characterization that something in the system is persistently "stuck".

A "ASSUME" constraint p restricts the search to only include states where p is true. That is, no paths along which p is false anywhere are reported. These are written to force the search to avoid certain cases, such as unrealistic stimuli. A "FAIR" constraint p restricts the search to only include paths along which p is true infinitely often, i.e., avoiding any paths where p is not true for some infinite sequence of states. These are written to avoid infinite paths considered "unfair", in that they unrealistically avoid taking some action forever.

If p is a predicate over state variables, a FAIL is a safety property written in LTL as G NOT p, (that is, NOT p holds in all reachable states). A LIVELOCK is a liveness property written in LTL as NOT FG p (there is no infinite path where eventually p holds forever). These are specified respectively as:

FAIL "my_fail": p;
LIVELOCK "my_livelock": p.

The strings "my_fail" and "my_livelock" are names given to these properties. A fail property is said to "hit" if the model checker finds a reachable state satisfying p, and a livelock property is "hit" if the model checker finds an infinite path where eventually p holds forever. If a property is established to not be hit for any state/infinite path, the property is said to be proven.

Corresponding constraints for these properties are written as:

ASSUME "my_assume": NOT p;
FAIR "my_fair": NOT p.

The ASSUME constraint "my_assume" restricts the explored infinite paths to those which satisfy NOT p at every step. The FAIR constraint "my_fair" restricts the explored infinite paths to those that assert p infinitely often.

As an example, suppose the hardware model has a list of support fails and livelocks that are proven on the hardware model. These support fails and livelocks can be written respectively as:

FAIL "support_fail": (logic expression over signal set S);
LIVELOCK "support_livelock": (logic expression over signal set S), where the set S of signals is defined to be the union of all signals appearing in a support or top-level fail or livelock. It is assumed that the names of FAIL, LIVELOCK, ASSUME or FAIR do not conflict with existing signal names, and implicitly define a new signal assigned to be the expression following the colon.

In embodiments of the invention, signals, properties and assumptions are generated to append to the hardware testbench, to create the appended testbench. The approach is to introduce fresh abstract versions of each signal of S, that are constrained according to support properties proven in the hardware model. Each top-level property has an abstract version, expressed over analogous abstract signals.

The general appended testbench construction is given below.

General Construction

In the discussion below, the notation "<=" is used as an assignment operator, that is signal<=RHS;
means "(each time step): evaluate the right hand side to determine if the value is 0 or 1, and assign this to signal".

The notation "=>" is used as a logical implication operator

This can be replaced with "->" or "==>", or can be circumvented entirely be expressing

A=>B with (NOT A) OR B

Which is logically equivalent.

The truth table for A=>B, as suggested by this equivalence, is

A|B|A=>B 0 0 1
0 1 1
1 0 0
1 1 1

As an example, the discussion below uses the expression:

ASSUME "cnt_progress constr": (delay(count
    (0:5))!=63)=>((delay(count(0:5))==count(0:5))
    OR((delay(count(0:5)+1)==count(0:5)));

This means "Assume that if [delay(count(0:5)) is not 63] then [the count did not change OR the count incremented]; otherwise if [delay(count(0:5) is equal to 63], then no assumption is made".

Figure 2:
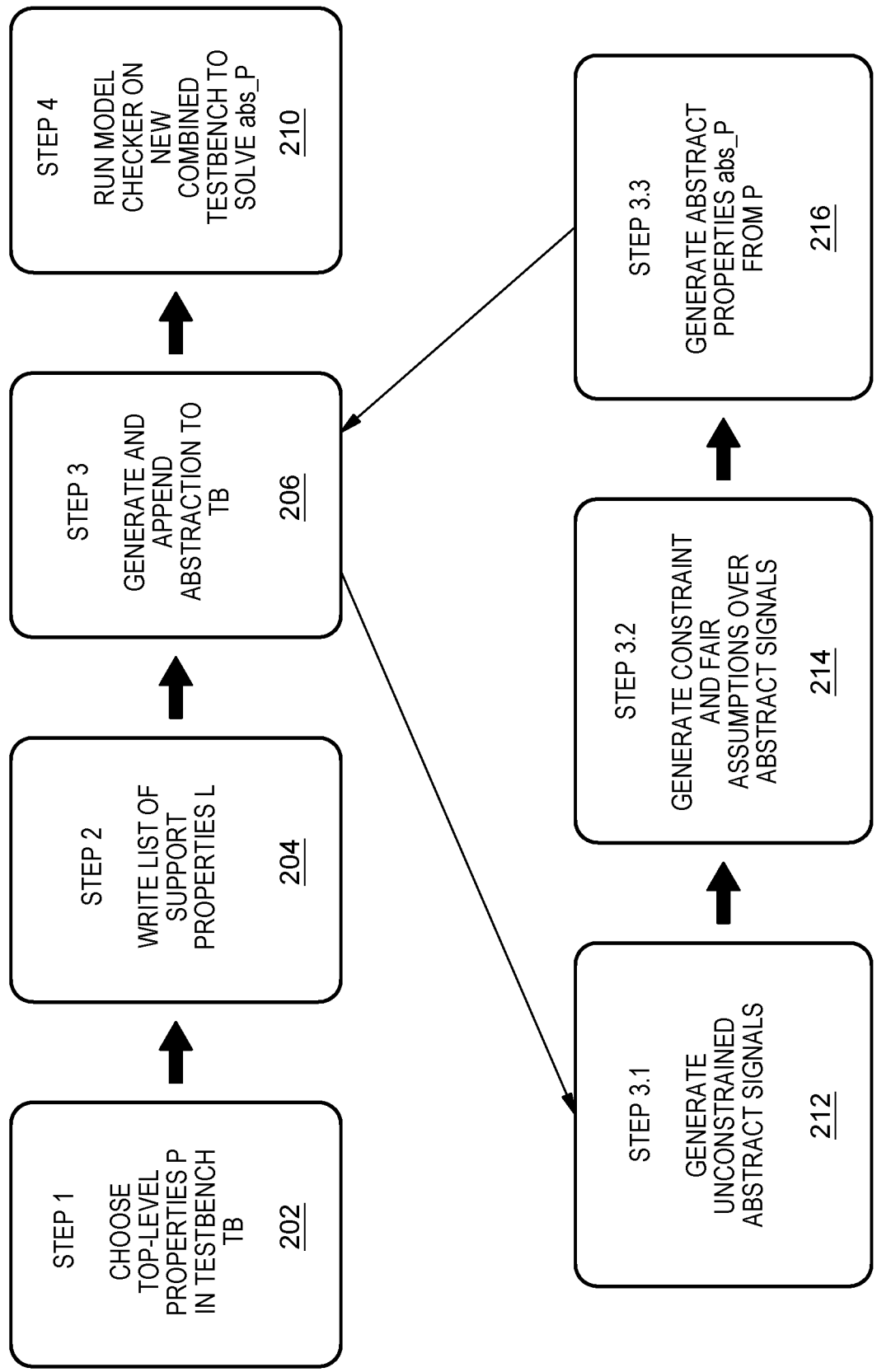
FIG. 2 illustrates an example procedure of an embodiment of the invention.

With reference to FIG. 2, in embodiments of the invention, at 202, one or more top-level properties P are chosen in the testbench TB. The properties P may be chosen or identified to the verification engineer because the properties are intractable. At 204, a list of support properties L is written. The support properties may be chosen or identified to the verification engineer so that the collective presence of the support properties in the hardware design implies the presence of an associated one of the top-level properties P in the hardware design. At 206, abstractions are generated from the support properties and appended to the testbench TB. The model checker is run, at 210, on the new combined testbench to solve for the abstract properties abs_P.

In the general case, the signals generated at 206 and used to create the appended testbench have three sections, discussed below. This code, at 212, defines abstract versions of hardware signals mentioned in support properties that are driven nondeterministically (Section 1), but constrained, at 214, by assumptions provided that the corresponding property holds in the DUT (Section 2). The properties of interest are expressed, at 216, using abstract signals, where a proof is inherited to the corresponding property in the DUT (Section 3).

Section 1: Section 1, at 212, is to declare abstract versions of all signals mentioned in the top-level or support properties.

These signals are initialized nondeterministically, and driven nondeterministically at each time-step. Constraints on the behavior of the signals are specified in Section 2 discussed below. The symbol "#" indicates the remainder of the line is a comment.

The initialized signals can be represented as:
(for each signal s in signal set S):
abs_s<=nondet( ) #fresh signal "abs_s", driven nondeterministically.

Section 2: At 214, for each support property "l" of L, a corresponding assumption "a" is defined This assumption "a" effectively says that if "l" holds along a given path in the hardware model, then it is safe to assume "l" over the abstract signals along that path. In particular, if "l" holds along all paths, then it is always sound to assume "l" over the abstract signals. However, if "l" does not hold in the hardware model, then the assumption has no effect.

This can be represented as:
(for each support property FAIL "support_fail"):
support_fail_hit<=support_fail OR delay(support_fail_hit); # latch initialized to 0;
abs_support_fail<=(corresponding expression over support_fail signals with "abs_"prefix); ASSUME "abs_support_fail_constr": support_fail_hit OR NOT abs_support_fail;
(for each support LIVELOCK "support livelock"):
guess_support_livelock<=nondet( ) OR delay(guess_support_livelock); # latch initialized to 0;
ASSUME "abs_support_fail_constr": support_fail AND NOT support_livelock);
abs_support_livelock<=(corresponding expression over support_livelock signals with "abs_" prefix);
FAIR "abs_support_livelock_fair": guess_support_livelock OR NOT abs_support_livelock;

Section 3: Section 3, 216, is to create abstract versions of top-level properties, referring to abstract signals.

By construction, a proof that these abstract properties are unhittable implies that the corresponding top-level property is also unhittable.

This can be represented as:
(for each top-level FAIL "top_fail"):
FAIL "abs_top_fail": (corresponding expression over top_fail signals with "abs_" prefix). (for each top-level LIVELOCK "top_livelock");
LIVELOCK "abs_top_livelock": (corresponding expression over top_livelock with "abs_" prefix).

Although each "not abs_support_fail" signal is assumed along any finite path prefix for fails "support_fail" that are hittable, it is a sound assumption because it is only assumed along paths and for as many time steps as "support_fail" holds.

The FAIR constraints are sound because they only hold along infinite paths where "support_livelock" always de- asserts in the future. Otherwise, "guess_support_livelock" may assert along a path at some point after which "support_livelock" remains asserted forever, and the assumption "abs_support_livelock_fair" is satisfied without constraining abstract signals. Paths where "guess_support_livelock" asserts earlier than a falsification of "support_livelock" are discarded by the assumption "abs_support_livelock_constr". In cases where "support_livelock" is not hittable, no paths where "guess_support_livelock" asserts will be infinite, and all infinite paths will assume "abs_support_livelock" is proven.

The choice of signals to include in S could be generalized to include signals that drive signals appearing on the RHS of some support or top-level property. For example:
FAIL "my_fail": a AND NOT b;
a<=c AND d;
b<=e OR NOT f;
could be expanded as:
FAIL "my_fail": (c AND d) AND NOT (e OR NOT f);
such that S includes c, d, e and f.

In embodiments of the invention, only RHS signals are included in S, but it may be convenient for the user to control the depth of signal dependency to include in S.

In embodiments of the invention, this abstraction approach can be layered multiple times. For instance, let the support properties be called abs0, and the first abstraction layer properties, previously referred to as "top", be called abs1. After the abs1 properties are proven using the above approach, the procedure is repeated using abs1 properties as support properties and abs2 properties as the top level. This is repeated until the desired properties absN are proven.

In embodiments of the invention, the above construction is for two specific forms of LTL formulas as properties, but the same approach may be used for arbitrary LTL formulas. Using standard LTL to Buchi automaton translation, signals are added to the checking logic that represent a Buchi automaton that accepts infinite paths that violate the LTL formula. A Buchi automaton accepts an infinite path if it visits an accepting state infinitely often, so a similar "guess" signal as "guess_support_livelock" can be used to guess when an accepting state will not be visited again along the path. Therefore, even if the model checking tool does not directly support LTL formulas, they can be used as support and top-level properties if the tool supports livelocks.

The following description proceeds with a first example involving two signals, followed by a second example with a counter, which is contrasted with a two testbench approach.

Example 1

Consider a hardware model that contains two signals, x and y, and a property of interest:
LIVELOCK "y_stuck": y.
Suppose that the following two properties are provable:
LIVELOCK "x stuck": x;
FAIL "x neq y": x !=y.
Embodiments of the invention create the appended testbench with abstract versions of x and y driven nondeterministically, and with assumptions relating the hardware and abstract signals:
abs_x<=nondet( ) and
abs_y<=nondet( )
To leverage the provable property "x_neq_y", a latch,
x_neq_y_hit<=x_neq_y OR delay(x_neq_y); # latch initialized to 0, is introduced. This latch stays high forever after a step that hits "x_neq_y". However, since this property is provable to never be true, there is no path that will assert the latch.

An abstract signal, abs_x_neq_y<=abs_x !=abs_y, is added to the testbench that captures the "x_neq_y" property over the abstract signals.

The abstract signals are constrained so that abs_x_neq_y does not assert along paths where the property "*x_neq_y" is unhittable. This can be represented as:

leverage x_neq_y
ASSUME "abs_x_neq_y_constr": x_neq_y_hit OR NOT abs_x_neq_y;

To leverage the above-identified proven livelock property LIVELOCK "x_stuck", a latch, guess x_stuck<=nondet( )OR delay(guess_x stuck); # latch initialized to 0, is introduced. This latch nondeterministically asserts and remains high forever, and the latch "guesses" that x will stay high after the guess.

An abstract signal abs_x_stuck is added to the testbench that captures the "x_stuck" property over the abstract signals.

abs_x_stuck<=abs_x;

Since "x_stuck" is provable to never occur, there is no path where x remains high forever, so the following constraint discards any path that asserts the guess:

ASSUME "abs_x_stuck_constr": NOT (guess_x_stuck AND NOT x_stuck).

A FAIR constraint:
leverage x_stuck
FAIR "abs_x_stuck_fair": guess_x_stuck OR NOT abs_x_stuck;

is added to the testbench. This fairness assumption is that along every path, either the guess is made or abs_x is not stuck high forever.

A new property,

LIVELOCK "abs_y_stuck": abs_y, is written over the abstract versions of "y_stuck", the property of interest.

If the new property "abs_y_stuck" is proven, it can be soundly concluded that "y_stuck" is also proven.

While the properties "x_stuck" and "x_neq_y" are inferred on the abstract signals, these properties are otherwise unconstrained. In the hardware model, x and y may depend on a complex cone of influence involving many inputs, gates and latches that must be analyzed by model checking algorithms.

Example 2

In this example, a complex hardware model is given, and a user wants to show that a counter will eventually reach a maximum value, captured by a top-level property livelock:

LIVELOCK "cnt_sat": count(0:5) !=63.

To establish this top level property, the formal verification engineer proposes and leverages two support properties: a livelock property "cnt_stuck" and a fail property. The livelock property "cnt_stuck" is hit if the counter can be stuck to one value forever, and the fail property is that when the counter is not 63, at the next step, the counter either stays at the same value or increments by one. In this example, all signals are initialized to 0, and "delay(s)" is the one previous step value of signal "s".

The livelock and fail properties can be expressed as:

LIVELOCK "cnt_stuck": delay(count(0:5))==count(0:5); and

FAIL "cnt_progress": NOT ((delay(count(0:5))!==63)=>((delay(count(0:5))==count(0:5)) OR ((delay(count(0:5))+1)==count(0:5)))).

If these properties are proven in the hardware model, one approach to verify LIVELOCK "cnt_sat" is to create a separate testbench that is an abstraction of the hardware model. All signals other than count(0:5) are ignored, count(0:5) is driven nondeterministically subject to the proven properties, and count(0:5) has the same top-level property.

The abstract testbench in its entirety is:

count(0:5)<=nondet( ) # count is driven nondeterministically
assume the proven property "cnt_stuck";
FAIR "cnt_stuck_fair": NOT (delay(count(0:5))==count(0:5));
assume the proven property "cnt_progress";
ASSUME "cnt_progress constr": (delay(count(0:5)) !=63)=>((delay(count(0:5))==count(0:5)) OR ((delay(count(0:5))+1)==count(0:5)));
LIVELOCK "cnt_sat": count(0:5) !=63.

This model overapproximates the behaviors of count(0:5) relative to the hardware model, and since the livelock is an LTL property that is quantified over all paths, proving "cnt_sat" in the abstraction is inherited in the hardware model.

In contrast with this separate testbench approach, embodiments of this invention create an abstraction that is added to the hardware model, and which may be constructed prior to proving support properties. An aspect of embodiments of the invention is that support properties only enforce constraints on the abstraction if the support properties are indeed provable.

In the above-discussed "cnt_sat", "cnt stuck" and "cnt_progress", there is only one RHS signal, so the set S={count(0:5)}. In this example, an abstract version of this signal is used, driven nondeterministically.

Section 1: abstract signals driven to random
abs_count(0:5)<=nondet( ).

The behavior of abs_count(0:5) is constrained by assuming the analogue to "cnt_progress" holds, but along a given path it is only valid to do so for the prefix up to the step where "cnt_progress" is hit. If "cnt_progress" is proven, then it is sound to assume "cnt_progress" along all paths for all steps.

To implement this, a latched signal
"cnt_progress_hit"
is introduced, which asserts when "cnt_progress" is asserted, and stays asserted.

Section 2: constraint/fair cnt progress_hit<=cnt_progress OR delay(cnt_progress_hit); # latch initialized to 0.

A signal
"abs cnt_progress"
is introduced, which is assigned to be the "cnt_progress" expression, but over abs_count(0:5) rather than count(0:5). This can be represented as:

abs_cnt_progress<=NOT ((delay(abs_count(0:5))!=63)=>((delay(abs_count(0:5))==abs_count(0:5)) OR ((delay(abs_count(0:5))+1)==abs_count(0:5)))).

The behavior of abs_count(0:5) is constrained by (the negation of) abs_cnt_progress, so long as cnt_progress has not been hit. This can be expressed as follows:

ASSUME "abs_cnt_progress_constr": cnt_progress_hit OR NOT abs_cnt_progress.

If fail "cnt_progress" is provable, then "cnt_progress hit" will not assert and "not abs_cnt_progress" is assumed for all paths and all steps.

For the support property LIVELOCK, the behavior of abs_count(0:5) is constrained by assuming the analogue of "cnt_stuck" holds, but only for those paths for which the "cnt_stuck" livelock is not hit. To achieve this, a latched signal "guess_cnt_stuck" is introduced that is nondeterministically set to 1. This signal "guesses" the step at which "cnt_progress" is stuck high forever. When an incorrect guess is made, a constraint enforces that a dead-end path occurs, which is discarded for the purposes of checking liveness properties. This can be expressed as follows:

guess_cnt_stuck<=nondet( )OR delay(guess_
cnt_stuck); latch initialized to 0 # dead-end if
guess is incorrect;

ASSUME "abs_cnt_stuck_constr": NOT (guess_cnt-
_stuck AND NOT cnt_stuck).

A signal "abs_cnt_stuck" is introduced to the testbench which is assigned to be the "cnt_stuck" expression, but over abs_count (0:5) rather than count(0:5).

abs_cnt_stuck<==delay(abs_count(0:5))==abs_count(0:5).

The infinite behavior of abs_count(0:5) is constrained such that (the negation of) abs_cnt_stuck always eventually asserts, unless a correct guess is made that livelock "cnt_stuck" is hit on this path. This can be represented as:

FAIR "abs_cnt_stuck_fair": guess_cnt_stuck OR NOT abs_cnt_stuck.

If livelock "cnt_stuck" is provable, then guess_cnt_stuck does not assert along any infinite path, and always-eventually not abs_cnt_stuck is assumed for all infinite paths.

For the top-level property, the abstract analogue, over abs_count(0:5) is included in the testbench.

Section 3: abstract properties
LIVELOCK "abs_cnt_sat": abs_count(0:5)!=63.

Consider the case that both support properties are not hittable in the hardware model.

Suppose that prior to checking the property "abs_cnt_sat", the model checking tool proves both support properties. If the model checking tool includes a feature to reuse proven results as assumptions, then checking "abs_cnt_sat" ought to be very similar in difficulty to the above-discussed two-model approach, as the tool should easily determine that "cnt_progress_hit" will never assert, and "guess_cnt_stuck" will never assert along an infinite path. However, this use mode need not be followed—it is sound to check the property "abs_cnt_sat" directly without explicitly proving the support properties, or they can be checked in tandem.

Figure 3C:
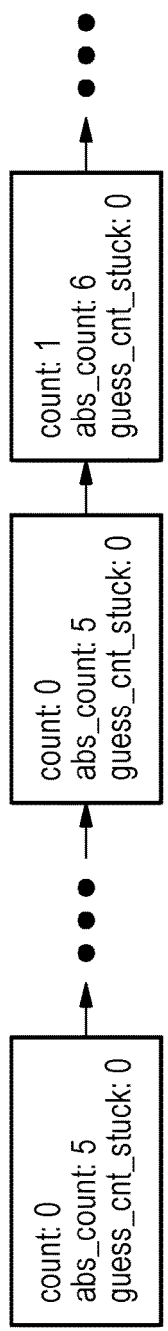
FIGS. 3(c), 3(d) and 3(e) show example execution of hardware livelock events that may be identified in an embodiment of the invention.
Figure 3D:
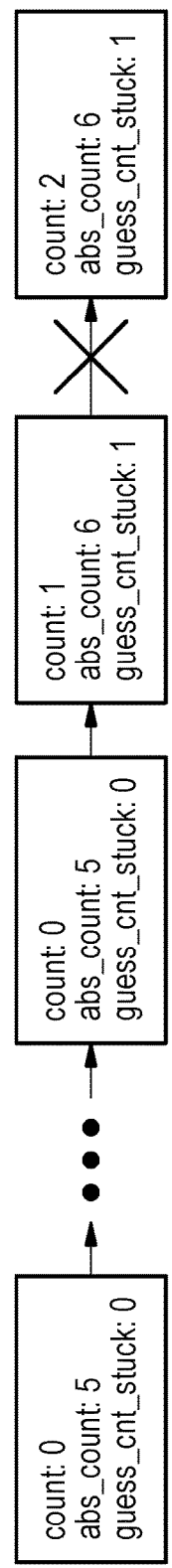
Figure 3E:
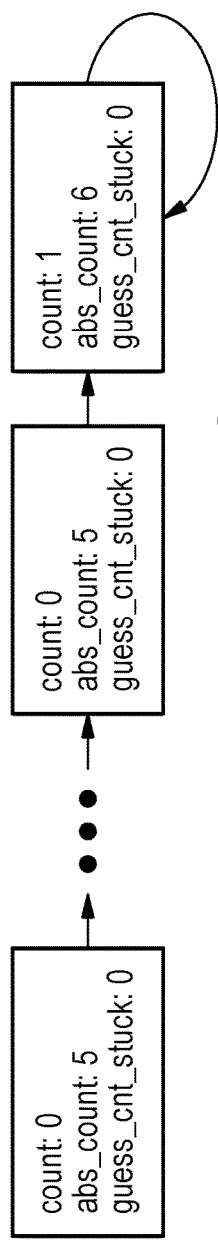

FIGS. 3(*a*)-3(*e*) shows example executions from an initial state. When both support properties are provable, the executions shown in FIGS. 3(*b*) and 3(*e*) are not possible. FIG. 3(*a*) shows an execution where "cnt_progress_hit" does not assert, which constrains abs_count to increment by 1 or 0 each transition. FIG. 3(*c*) shows an execution "guess_cnt_stuck" that does not assert, along which abs_count cannot remain at the same value indefinitely. FIG. 3(*d*) shows an execution that is not valid, as any transition where count changes is invalid following the assertion of "guess_cnt_stuck".

On the other hand, suppose that in the hardware model, there exists a path along which some state has count(0:5)=0, and the next state has count(0:5)==9. The latter state will assert "cnt_progress" and "cnt_progress_hit", which means the subsequent transitions place no constraint on abs_count. See FIG. 3(*b*). Similarly, suppose that in the hardware model, there exists a path along which count has the value 1 for an infinite sequence of states. Then, "guess_cnt_stuck" may assert along this infinite sequence and constraint "abs_cnt_stuck_constr" is satisfied. See FIG. 3(*e*).

In the appended testbench, a path exists that is identical to P in signals from the hardware model, where both "cnt_progress_hit" and "guess_cnt_stuck" assert at step X. Since "cnt_stuck" remains asserted for the rest of the path after step X, the guess is correct and this path is infinite, and both "abs_cnt_progress_assume" and "abs_cnt_stuck_fair" are satisfied with no constraint on the behavior of "abs_count (0:5)". There are many such paths that will hit the livelock "abs_cnt_sat", depending on the behavior of abs_count(0:5) after step X, for example, where "abs_count(0:5)" is stuck to 0. Therefore, in this example, the livelock "abs_cnt_sat" is hittable provided the two support properties are also hittable.

Figure 4:
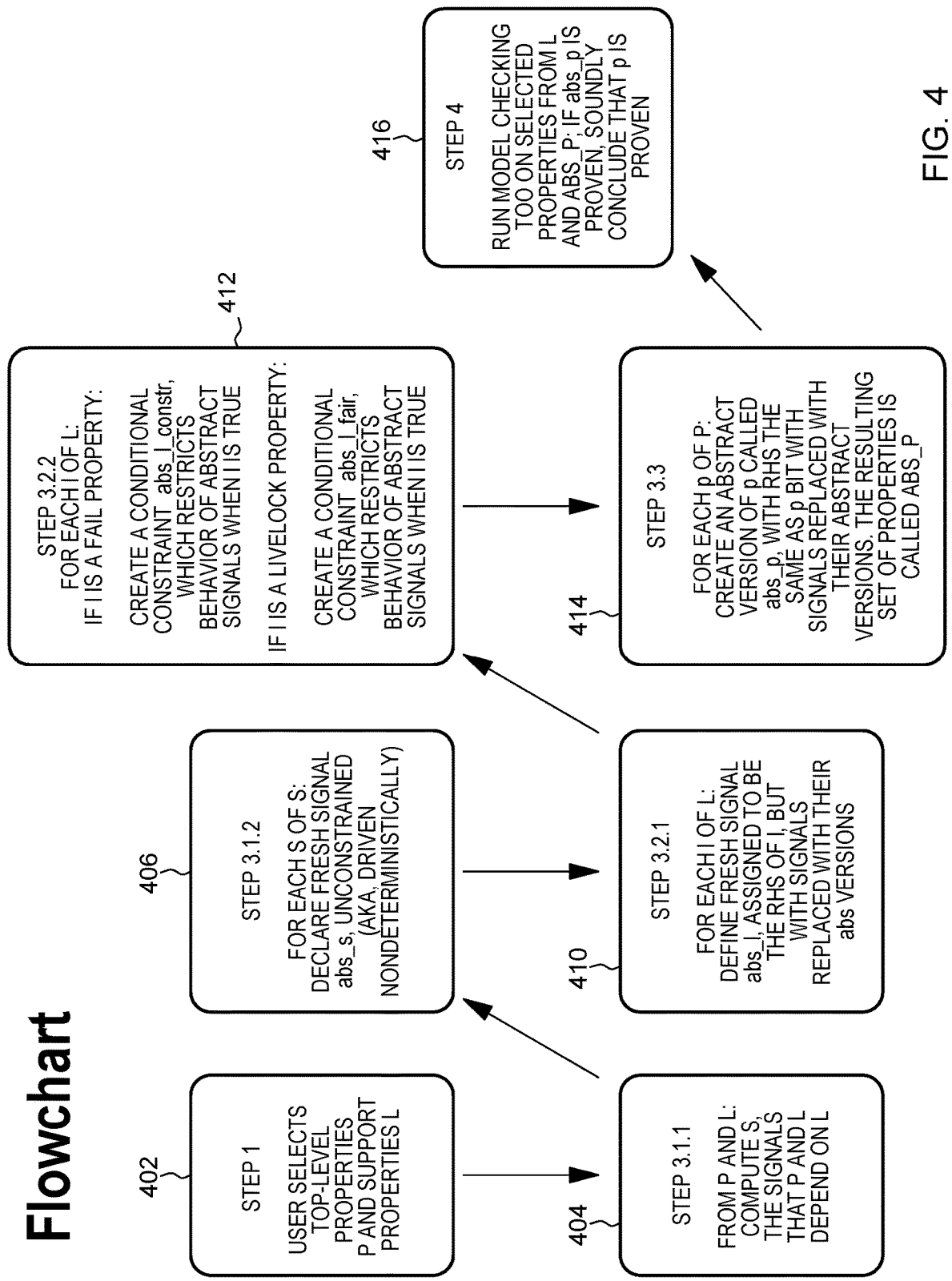
FIG. 4 illustrates in more detail an embodiment of Step 3 of FIG. 2.

FIG. 4 illustrates in more detail an embodiment of Step 3 of FIG. 2. In embodiments of the invention, this Step 3 is automated.

With reference to FIG. 4, at 402, a user selects top-level properties P and support properties L. P is a set of one or more top-level properties p, and L is a set of one or more support properties l for the top level properties p of P. A formal testbench includes a hardware design-under-test (DUT).

At 404 (step 3.1.1): Compute S, the hardware signals s appearing in properties of P and L. At 406 (step 3.1.2): For each s of S, declare a fresh abstract signal abs_s, unconstrained (aka, driven nondeterministically). (This step is the above-discussed "Section 1"). At 410 (step 3.2.1): For each property l of L, create a fresh abstract signal abs_l, assigned to be the right-hand-side of l, but with signals replaced with their abstract versions. (This step is part of the above-discussed "Section 2")

At 412 (step 3.2.2): For each l of L: (This step is part of the above-discussed "Section 2")
If l is a fail property:
create a latch that tracks if l has been hit, i.e.
   support_l_hit<=l or delay(support_l_hit);
create a conditional constraint abs_l_constr, which
   restricts behavior of abstract signals when l is true, i.e.
   ASSUME "abs_l_constr": support_l_hit or NOT abs_l.
If l is a livelock property:
create a latch that nondeterministically guesses if the
   livelock will remain asserted, i.e.
   guess_support_livelock<=nondet( )OR
   delay(guess_support_livelock);
create an assumption to ignore those paths where the
   guess is wrong, i.e
   ASSUME "abs_l_livelock_constr": NOT (guess_support_livelock AND NOT support_livelock);
create a conditional FAIR constraint abs_l_fair, which
   restricts behavior of abstract signals when l is true, i.e.
   FAIR "abs_l_livelock_fair": guess_support_livelock
      OR NOT abs_l.

At 414 (Step 3.3): For each p of P: create an abstract version abs_p, and call the resulting set of properties ABS_P (This step is the above-discussed "Section 3")
If p is a fail property:
create an abstract fail property abs_p_fail, i.e.
FAIL "abs_p_fail": abs_p.
If p is a livelock property:
create an abstract livelock property abs_p_livelock, i.e.
FAIL "abs_p_livelock": abs_p.
Following automated Step 3, in embodiments of the invention, manual Step 4 is performed, at 416, by the user.

By running a formal verification tool on properties L and ABS_P, if abs_p is proven, it is sound to conclude that p is also proven.

The following example illustrates the above-discussed details of the Step 3 procedure.

In this example, a user wishes to prove that signals "a" and "b" are mutually exclusive, that is, they never assert at the same time.

A top-level property can be written as:
FAIL "a_b_mux": a AND b.

In this example, the user wants to establish that this property is true indirectly, by identifying a 3rd signal "c", and showing that when c is 0, a is also 0, and when c is 1, b is 0. This expectation can be expressed by two support properties:
FAIL "c_0_impl_a_0": (NOT c) AND a; and
FAIL "c_1_impl_b_0": c AND (NOT b).

Using an embodiment of this invention, with P={a_b_mux} and L={c_0_impl_a_0, c_1_impl_b_0}:
Step 3.1.1: Compute S={a, b, c}
Step 3.1.2: Declare fresh abstract signals abs_a, abs_b, abs_c. These are (for now) driven nondeterministically.
Step 3.2.1: Create abstract versions of (signals representing) support properties. In this example, there is a signal for each property. For example:
FAIL "c_0_impl_a_0": (NOT c) AND a;
implicitly defines a signal
c_0_impl_a_0<=(NOT c) AND a.

In the above discussion, the name "c_0_impl_a_0" is used to refer to both a signal and a property, These could be disambiguated by calling the former "c_0_impl_a_0_sig", or a similar name. In this discussion, however, the name "c_0_impl_a_0" is used to refer to both a signal and a property:
abs_c_0_impl_a_0<=(NOT abs_c) AND abs_a;
abs_c_1_impl_a_0<=(NOT abs_c) AND abs_a.

```
Step 3.2.2: For each support property 1 of L =
{c_0_impl_a_0, c_1_impl_b_0}:
    create a latch that tracks if 1 has been hit, i.e.
        support_c_0_impl_a_0_hit      <=    c_0_impl_a_0    or
        delay(support_c_0_impl_a_0_hit),
        support_c_1_impl_b_0_hit      <=    c_1_impl_b_0    or
        delay(support_c_1_impl_b_0_hit);
    create a conditional constraint abs_1_constr, which
    restricts behavior of
    abstract signals when 1 is true, i.e.
        ASSUME "abs_c_0_impl_a_0_constr":
        support_c_0_impl_a_0_hit
        or NOT abs_c_0_impl_a_0;
        ASSUME "abs_c_1_impl_b_0_constr":
        support_c_1_impl_b_0_hit or NOT abs_c_1_impl_b_0.
```

Step 3.3: For each p of P: create an abstract version of abs_p, and call the resulting set of properties ABS_P (This step is the above-discussed "Section 3")
In this example, there is only one element of P, p=a_c_mux;
create an abstract fail property abs_p_fail, i.e.
FAIL "abs_p_fail": abs_a AND abs_b.
In embodiments of the invention, an abstract version of this is created automatically:
FAIL "abs_a_b_mux": abs_a AND abs_b.
In embodiments of the invention, with the construction of support properties, and constraints over abstract signals, [abs_a_b_mux proven unhittable] implies that [a_c_mux] is proven unhittable.

Figure 5:
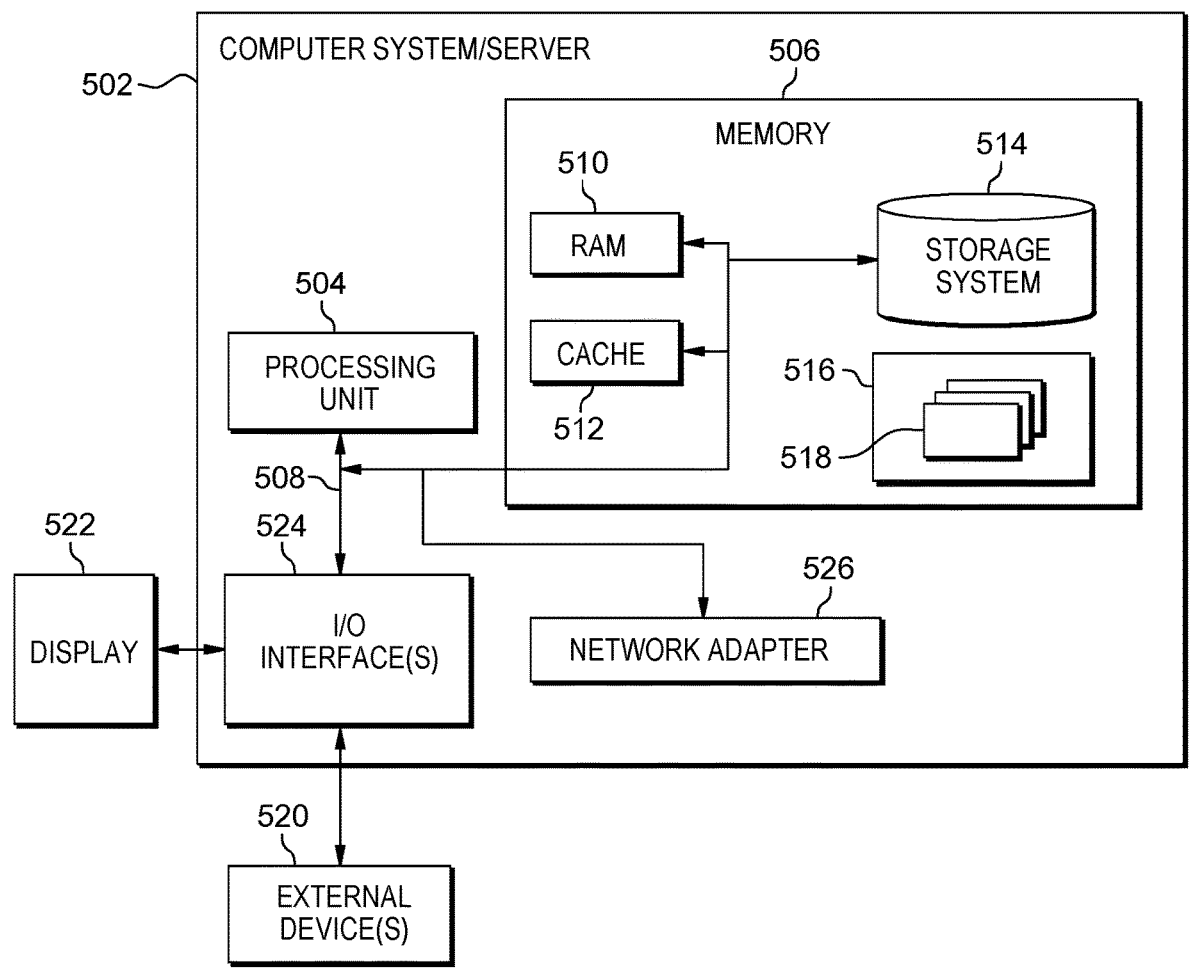
FIG. 5 is a block diagram illustrating a detailed view of an information processing system according to one embodiment of the present invention.

FIG. 5 shows a schematic of an exemplary information processing system 502 for use in embodiments of the present invention. Information processing system 502 is only one example of a suitable system and is not intended to limit the scope of use or functionality of embodiments of the present invention described above. The exemplary information processing system 502 is capable of implementing and/or performing any of the functionality set forth above. The information processing system 502 can be an information system communicatively coupled to a wireless communications network, a personal computer system, a server computer system, a thin client, a thick client, a hand-held or laptop device, a tablet computing device, a multiprocessor system, a microprocessor-based system, a set top box, a programmable consumer electronic, a network PC, a minicomputer system, a mainframe computer system, a distributed cloud computing system, or the like.

As illustrated in FIG. 5, the information processing system 502 is in the form of a general-purpose computing device. The components of the information processing system 502 can include, but are not limited to, one or more processors or processing units 504, a system memory 506, and a bus 508 that couples various system components including the system memory 506 to the processor 504. The bus 508 represents one or more of any of several types of bus structures, including a memory bus or memory controller, a peripheral bus, an accelerated graphics port, and a processor or local bus using any of a variety of bus architectures.

The information processing system 502 typically includes a variety of computer system readable media. Such media may be any available media that is accessible by the information processing system 502, and it includes both volatile and non-volatile media, removable and non-removable media. Although not shown, the processor 504 can include the monitor 106 of FIG. 1. The system memory 506 can also include computer system readable media in the form of volatile memory, such as random access memory (RAM) 510 and/or cache memory 512.

The information processing system 502 can further include other removable/non-removable, volatile/non-volatile computer system storage media. By way of example only, a storage system 514 can be provided for reading from and writing to a non-removable or removable, non-volatile media such as one or more solid state disks and/or magnetic media (typically called a "hard drive"). In such instances, each can be connected to the bus 508 by one or more data media interfaces. The memory 506 can include at least one program product having a set of program modules that are configured to carry out the functions of an embodiment of the present invention.

Program/utility 516, having a set of program modules 518, may be stored in memory 406 by way of example, and not limitation, as well as an operating system, one or more application programs, other program modules, and program data. Each of the operating system, one or more application programs, other program modules, and program data or some combination thereof, may include an implementation of a networking environment. Program modules 318 generally carry out the functions and/or methodologies of embodiments of the present invention.

The information processing system 502 can also communicate with one or more external devices 520 such as a keyboard, a pointing device, a display 522, etc.; one or more devices that enable a user to interact with the information processing system 502; and/or any devices (e.g., network card, modem, etc.) that enable computer system/server 502 to communicate with one or more other computing devices.

Such communication can occur via I/O interfaces 524. In addition, the information processing system 502 can communicate with one or more networks such as a local area network (LAN), a general wide area network (WAN), and/or a public network (e.g., the Internet) via network adapter 526. As depicted, the network adapter 526 communicates with the other components of information processing system 502 via the bus 508. Other hardware and/or software components can also be used in conjunction with the information processing system 502.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The description of the invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and applications of the invention, and to enable others of ordinary skill in the art to understand the invention. The invention may be implemented in various embodiments with various modifications as are suited to a particular contemplated use.

The invention claimed is:

1. A computer-implemented method comprising:
    identifying a set L of one or more support properties l for a set P of one or more properties p for a given electronic circuit;
    computing a plurality of hardware signals of the given electronic circuit, including
        computing one or more hardware signals s appearing in the one or more of the support properties l of the set L, and
        computing one or more hardware signals appearing in one or more of the properties p of the set P;
    creating a plurality of abstract signals ABS, including
        declaring a fresh abstract signal abs_s for each of the hardware signals s, and
        creating a fresh abstract signal abs_l for each of the support properties l of the set L;
    for each of the properties p of the set P, creating an abstract property version abs_p; and
    appending the abstract signals ABS and the abstract property abs_p to a testbench, used for verifying the design of the electronic circuit, to form an appended testbench.

2. The method according to claim 1, wherein the creating an abstract signal abs_l for each of the support properties l includes creating one or more features for the abstract signal abs_l according to a given set of rules.

3. The method according to claim 2, wherein the creating one or more features for the abstract signal abs_l according to a given set of rules includes creating a conditional constraint for the abstract signal abs_l according to the given set of rules.

4. The method according to claim 3, wherein the creating one or more features for the abstract signal abs_l according to a given set of rules includes creating a latch for abs_l according to the given set of rules.

5. The method according to claim 1, wherein:
    the abstract property abs_p created for the each property p is an abstract fail property if said each property p is a fail property; and
    the abstract property abs_p created for the each property p is an abstract livelock property if said each property p is a livelock property.

6. The method according to claim 1, wherein each of the abstract signals ABS satisfies conditional constraints and is otherwise non-deterministic.

7. The method according to claim 1, further comprising identifying one or more constraints relating the abstract signals ABS and the support properties l of the set L.

8. The method according to claim 1, wherein the identifying a set L of one or more support properties l for a set P of one or more properties p for a given electronic circuit includes identifying the one or more support properties l to show that the electronic circuit has one or more of the properties p.

9. The method according to claim 8, wherein at least one of the properties p of the set P is intractable in the hardware design of the electronic circuit.

10. The method according to claim 1, further comprising using the appended testbench in a formal verification process to verify the design of the electronic circuit.

11. A system comprising:
    one or more processors; and
    a memory coupled to the one or more processors:
    said one or more processors configured for:
        identifying a set L of one or more support properties l for a set P of one or more properties p for a given electronic circuit;
        computing a plurality of hardware signals s of the given electronic circuit, including
            computing one or more hardware signals appearing in the one or more of the support properties l of the set L, and
            computing one or more hardware signals appearing in one or more of the properties p of the set P;
        creating a plurality of abstract signals ABS, including
            declaring a fresh abstract signal abs_s for each of the hardware signals s, and
            creating a fresh abstract signal abs_l for each of the support properties l of the set L;
        for each of the properties p of the set P, creating an abstract property version abs_p; and
        appending the abstract signals ABS and the abstract property abs_p to a testbench, used for verifying the design of the electronic circuit, to form an appended testbench.

12. The system according to claim 11, wherein the creating an abstract signal abs_l for each of the support properties l includes creating one or more features for the abstract signal abs_l according to a given set of rules.

13. The system according to claim 12, wherein the creating one or more features for the abstract signal abs_l according to a given set of rules includes creating a conditional constraint for the abstract signal abs_l according to the given set of rules.

14. The system according to claim 11, wherein:
    the abstract property abs_p created for the each property p is an abstract fail property if said each property p is a fail property; and
    the abstract property abs_p created for the each property p is an abstract livelock property if said each property p is a livelock property.

15. The system according to claim 11, wherein one or more processors are further configured for identifying one or more constraints relating the abstract signals ABS and the support properties l of the set L.

16. A computer program product comprising a computer readable storage medium having program instructions embodied therewith, the program instructions executable by a processor to cause the processor to:
    identifying a set L of one or more support properties l for a set P of one or more properties p for a given electronic circuit;
    computing a plurality of hardware signals s of the given electronic circuit, including
        computing one or more hardware signals appearing in the one or more of the support properties l of the set L, and computing one or more hardware signals appearing in one or more of the properties p of the set P;

creating a plurality of abstract signals ABS, including
  declaring a fresh abstract signal abs_s for each of the hardware signals s, and
  creating a fresh abstract signal abs_l for each of the support properties l of the set L;

for each of the properties p of the set P, creating an abstract property version abs_p; and appending the abstract signals ABS and the abstract property abs_p to a testbench, used for verifying the design of the electronic circuit, to form an appended testbench.

17. The computer program product according to claim 16, wherein the creating an abstract signal abs_l for each of the support properties l includes creating one or more features for the abstract signal abs_l according to a given set of rules.

18. The computer program product according to claim 17, wherein the creating one or more features for the abstract signal abs_l according to a given set of rules includes creating a conditional constraint for the abstract signal abs_l according to the given set of rules.

19. The computer program product according to claim 16, wherein:

the abstract property abs_p created for the each property p is an abstract fail property if said each property p is a fail property; and the abstract property abs_p created for the each property p is an abstract livelock property if said each property p is a livelock property.

20. The computer program product according to claim 16, wherein the program instructions are executable by the processor to cause the processor to identify one or more constraints relating the abstract signals ABS and the support properties l of the set L.

\* \* \* \* \*